United States Patent [19]

Yokota et al.

[11] Patent Number: 5,071,490
[45] Date of Patent: Dec. 10, 1991

[54] TANDEM STACKED AMORPHOUS SOLAR CELL DEVICE

[75] Inventors: Akitoshi Yokota; Yukihiko Nakata, both of Nara, Japan

[73] Assignee: Sharp Kabushiki Kaisha, Osaka, Japan

[21] Appl. No.: 516,689

[22] Filed: Apr. 30, 1990

Related U.S. Application Data

[63] Continuation-in-part of Ser. No. 324,735, Mar. 17, 1989, abandoned.

[30] Foreign Application Priority Data

Mar. 18, 1988 [JP] Japan .................................. 63-66082

[51] Int. Cl.$^5$ .................... H01L 31/075; H01L 31/18
[52] U.S. Cl. ........................................ 136/249; 437/4
[58] Field of Search ..................... 136/249 TJ; 437/4

[56] References Cited

U.S. PATENT DOCUMENTS 4,094,704  6/1978  Milnes ................................. 136/244
4,387,265  6/1983  Dalal .............................. 136/249 TJ

FOREIGN PATENT DOCUMENTS

56-148874  11/1981  Japan .............................. 136/249 TJ
63-122283  5/1988  Japan .............................. 136/249 TJ Primary Examiner—Aaron Weisstuch

[57] ABSTRACT

An amorphous solar cell is provided having a junction structure of a p layer, an i layer and n layer wher an electromotive force is generated when the cell is irradiated by light. The amorphous solar cell includes an upper cell and a lower cell which each have an i layer. The upper and lower cells are stacked so that the upper cell is located on the light incident side. An output end of the upper cell and an output end of the lower cell are connected in parallel. The thickness of the i layer of the lower cell is 300 Å or less. Because the thickness of the i layer of the lower cell is 3000 Å or less, the amorphous solar cell has a high initial photoelectric conversion efficiency and properties which are unlikely to be degraded by light.

15 Claims, 7 Drawing Sheets

TANDEM STACKED AMORPHOUS SOLAR CELL DEVICE

This application is a continuation-in-part of application Ser. No. 07/324,735 filed on Mar. 17, 1989, now abandoned.

BACKGROUND OF THE INVENTION

1. Field of the Invention

The present invention relates generally to amorphous solar cells, and more particularly, to an amorphous solar cell having a high initial photoelectric conversion efficiency and a suppressed light degradation rate.

2. Description of the Background Art

In general, an amorphous solar cell has many advantages. For example, because the amorphous solar cell has a larger absorption coefficient of light than that of a single crystal solar cell, the thickness of a silicon layer can be decreased. In addition, the manufacturing process is simple. Furthermore, because the manufacturing temperature is low, a small amount of energy is used during the manufacturing. However, in order to put the amorphous solar cell into practice as a solar cell for providing electric power, improvements must be made for the photoelectric conversion efficiency and the prevention of light degradation. As measures of preventing the above described light degradation, consideration has been given to the development of a material of an i layer which is not degraded by light or an improvement from the viewpoint of a structure produced by using a tandem cell (*Appl. Phys. Lett.*, 35(2), July 15, 1979).

Figure 10:
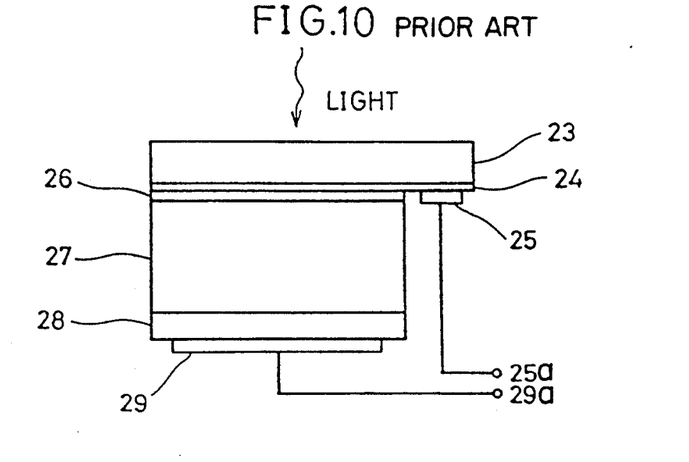
FIG. 10 is a diagram illustrating a conventional amorphous solar cell having a single cell structure.

FIG. 10 is a diagram illustrating a conventional amorphous solar cell having a single cell structure.

Referring now to FIG. 10, this amorphous solar cell includes a glass substrate 23. A transparent conductive film 24, a p layer 26, an i layer 27, and an n layer 28 are successively formed on the glass substrate 23 in the above described order. The transparent conductive film 24 is formed of, for example, ITO (Indium Tin Oxide) and $SnO_2$. The p layer 26 is formed by including p-type dopant impurities in amorphous silicon. The i layer 27 is formed of undoped amorphous silicon. The n layer 28 is formed by including n-type dopant impurities in amorphous silicon. An electrode 25 is provided on one end of the transparent conductive film 24. The electrode 25 is electrically connected to an output terminal 25a. An electrode 29 is provided on the n layer 28. The electrode 29 is electrically connected to an output terminal 29a. The electrodes 25 and 29 are formed of, for example, aluminum. Light enters the cell through the glass substrate 23 from the direction represented by the arrow.

Figure 11:
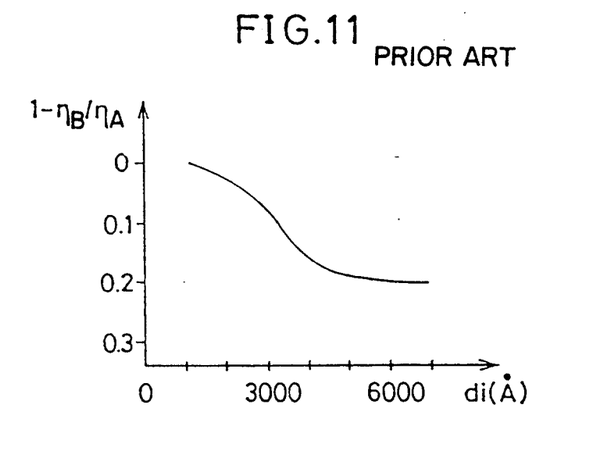
FIG. 11 is a diagram illustrating the relation between the thickness of an i layer and the amount of light degradation of a conventional single cell.

FIG. 11 illustrates the relation between the light degradation rate and the thickness of the i layer 27 of an amorphous solar cell having a single cell structure that is obtained when the cell is irradiated by light for 8 hours under the condition of AM (Air Mass)=1.100 mW/cm².

Figure 12:
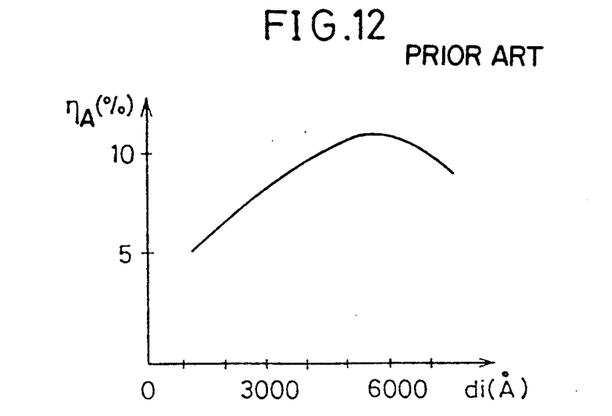
FIG. 12 is a diagram illustrating the relation between the thickness of the i layer and the initial photoelectric conversion efficiency of a conventional single cell.

Referring to FIG. 11, the abscissa represents the thickness (di) of the i layer 27 and the ordinate represents amount of light degradation $(1-\eta_B/\eta_A)$, where $\eta_A$ represents an initial photoelectric conversion efficiency and $\eta_B$ represents a photoelectric conversion efficiency after photoirradiation. FIG. 12 illustrates the relation between the initial photoelectric conversion efficiency $(\eta_A)$ and the thickness (di) of the i layer 27.

As is obvious from FIG. 11, when the thickness of the i layer 27 becomes 3000 Å or less, the amount of light degradation $(1-\eta_b/\eta_A)$ is rapidly decreased. On the other hand, as is obvious from FIG. 12, the initial photoelectric conversion efficiency $(\eta_A)$ is at a maximum when the thickness of the i layer 27 is around 6000 Å. Thus, the thickness i layer 27 must be decreased so as to reduce the amount of light degradation, while the thickness of the i layer 27 must be increased so as to increase the initial photoelectric conversion efficiency. Thus, it is difficult to reduce the amount of light light degradation of the cell while holding the initial photoelectric conversion efficiency at a constant value.

Figure 13:
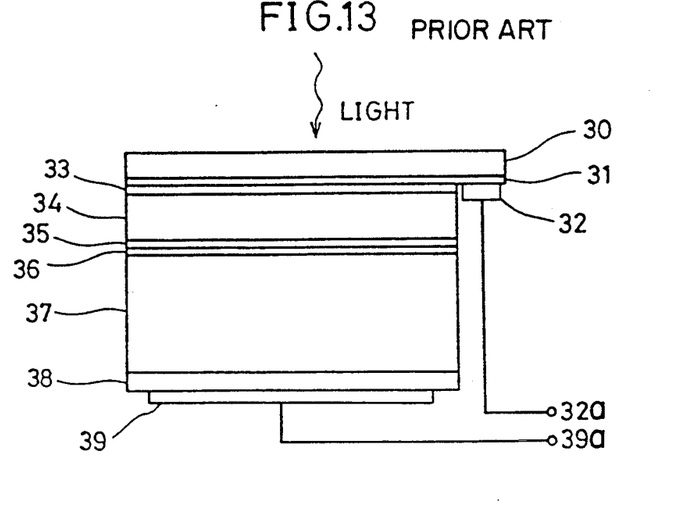
FIG. 13 is a diagram illustrating a conventional amorphous solar cell having a tandem cell structure.

FIG. 13 is a diagram illustrating a conventional amorphous solar cell having a tandem cell structure.

Referring to FIG. 13, this amorphous solar cell includes a glass substrate 30. A transparent conductive film 31, a p layer 33, an i layer 34, an n layer 35, a p layer 36, an i layer 37 and an n layer 38 are successively formed on the glass substrate 30 in the above described order. An electrode 32 is provided on one end of the transparent conductive film 31. The electrode 32 is electrically connected to an output terminal 32a. An electrode 39 is provided on the n layer 38. The electrode 39 is electrically connected to an output terminal 39a. Two cells each having a pin structure are connected in series Light enters the cell through the glass substrate 30 from the direction represented by the arrow.

In this conventional solar cell having a tandem cell structure, the thickness of the upper i layer 34 on the side of incident light can be made small, such as approximately 1000 Å. However, respective pin structures of the tandem cells are connected in series, so that the values of currents respectively generated on the upper i layer 34 and the lower i layer 37 must be equalized. Therefore, in order to obtain high light electric conversion efficiency, the thickness of the lower i layer 37 must be approximately 5500 Å.

Figure 14:
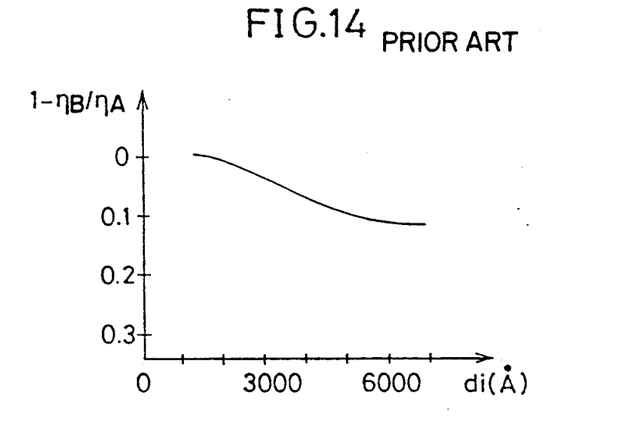
FIG. 14 is a diagram illustrating the relation between the thickness of a lower i layer and the amount of light degradation of a tandem cell.

FIG. 14 illustrates the relation between the thickness (di) of the lower i layer 37 and the amount of light degradation $(1-\eta_B/\eta_A)$ of the amorphous solar cell having a tandem cell structure illustrated in FIG. 13 that is obtained when the cell is irradiated by light for 8 hours with the thickness of the upper i layer 34 being approximately 1000 Å under the condition of AM=1.100 mW/cm².

Figure 15:
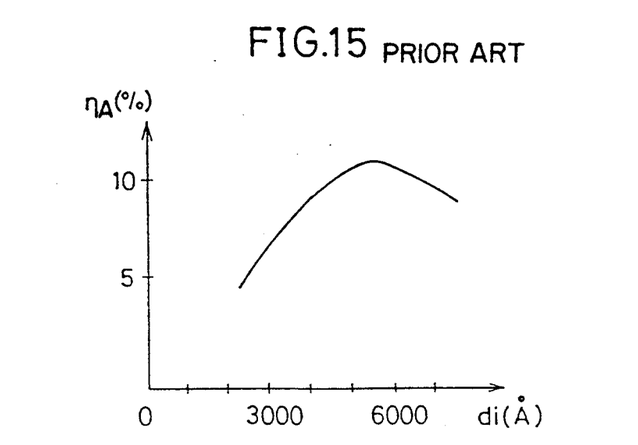
FIG. 15 is a diagram illustrating the relation between the thickness of the lower i layer and the initial photoelectric conversion efficiency of a conventional tandem cell.

FIG. 15 illustrates the relation between the thickness of the lower i layer 37 and the initial photoelectric conversion efficiency $(\eta_A)$ of the amorphous solar cell having a tandem cell structure illustrated in FIG. 13 that is obtained when the thickness of the upper i layer 34 is approximately 1000 Å.

As is obvious from FIG. 14, when the thickness of the i layer 37 of a lower cell becomes 3000 Å or more, the lower cell is degraded by the light. In this case, the thickness of the i layer 34 of an upper cell is small, approximately 1000 Å so that the upper cell is not degraded by the light. The amount of light incident on the lower cell, a part of the, incident light being absorbed by the upper cell, is approximately one-half of that of the single cell. Thus, the light degradation rate of the lower cell becomes approximately one-half of that of the single cell. The light degradation rate of the tandem cell is determined by the light degradation rate of the lower cell, which is approximately one-half of the single cell.

On the other hand, as is clear from FIG. 15, the initial photoelectric conversion efficiency ($\eta_4$) is at a maximum when the thickness of the i layer 37 of the lower cell is around 6000 Å.

More specifically, even in the amorphous solar cell having a tandem cell structure, the thickness of the lower i layer 37 must be decreased so as to reduce the amount of light degradation of the cell, as in the amorphous solar cell having a single cell structure. Consequently, the thickness of the lower i layer 37 must be increased so as to increase the initial photoelectric conversion efficiency. Thus, even in the amorphous solar cell having a tandem cell structure, it is difficult to reduce the amount of light degradation of the cell while maintaining the initial photoelectric conversion efficiency at a constant value.

As described above, it is difficult to reduce the amount of light degradation of the conventional amorphous solar cell while maintaining the initial photoelectric conversion efficiency whether the cell is of a single cell structure or a tandem cell structure.

SUMMARY OF THE INVENTION

An object of the present invention is to solve the above described problems and to provide an amorphous solar cell which has a high initial photoelectric conversion efficiency and a reduced amount of light degradation.

The amorphous solar cell according to an embodiment of the present invention includes an amorphous solar cell having a junction structure of a p layer, an i layer and an n layer, where electromotive force is generated when the solar cell is irradiated by light. The amorphous solar cell includes an upper cell and a lower cell with each cell having the above mentioned i layer. The upper and lower cells are stacked so that the upper cell is located on the incident side of the light. Output ends of the upper cell and the lower cell are connected in parallel. The thickness of the i layer of the lower cell is 3000 Å or less.

According to a preferred embodiment of the present invention, the thickness of the i layer of the upper cell is 1500 Å or less.

According to a further embodiment of the present invention, the ratio of the thickness of the i layer of the upper cell and the thickness of the i layer of the lower cell is between 1:2 and 1:2.5. In the conventional amorphous solar cell having a tandem cell structure, respective cells, which each have a pin structure, are connected in series. Consequently, the current values generated in the respective i layers must be equal. Accordingly, it is necessary to increase the thickness of the i layer of the lower cell to about 5500 Å.

On the other hand, in the amorphous solar cell according to an embodiment of the present invention, the cells, which each have the pin structure, are connected in parallel as described above. Therefore, it is not necessary to make the current values generated in the respective i layers equal. Accordingly, the thickness of the i layer of the lower cell can be made to be an optimum value of 3000 Å or less. If the thickness of the i layer of the lower cell is 3000 Å or less, conversion efficiency after irradiation can be improved as described below.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring now to the drawings, the preferred embodiments of the present invention will be described.

Figure 1:
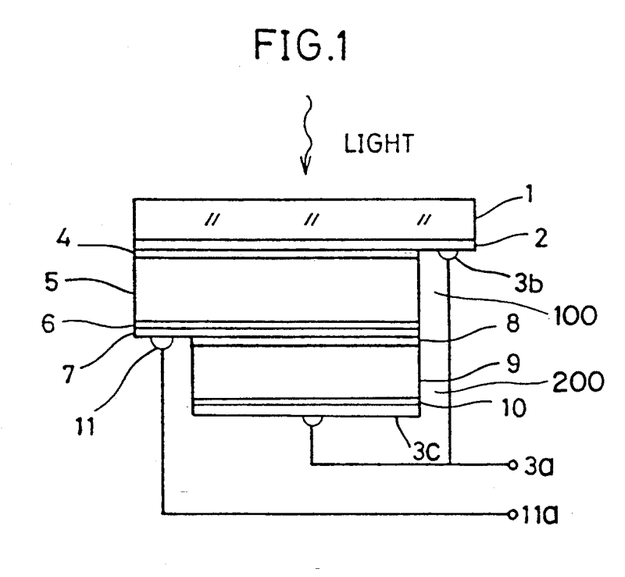
FIG. 1 is a diagram illustrating a structure of an amorphous solar cell according to a first embodiment of the present invention.

FIG. 1 is a diagram showing a structure of an amorphous solar cell according to a first embodiment of the present invention.

Referring to FIG. 1, the amorphous solar cell includes a glass substrate 1. A transparent conductive film 2, a p layer 4, an i layer 5, an n layer 6, a transparent conductive film 7, an n layer 8, an i layer 9 and a p layer 10 are successively formed on the glass substrate 1 in the above described order. A first cell including the p layer 4, the i layer 5 and the n layer 6 and a second cell including the n layer 8, the i layer 9 and the p layer 10 are stacked such that the first and second cells are positioned in opposite polarity with respect to each other. An electrode 3b is provided on one end of the transparent conductive film 2, an electrode 11 is provided on one end of the transparent conductive film 7, and an electrode 3c is provided on the p layer 10. The electrodes 3b and 3c are electrically connected to an output terminal 3a, and the electrode 11 is electrically connected to an output terminal 11. Consequently, output ends of the first cell including the p layer 4, the i layer 5 and the n layer 6 and the second cell including the n layer 8, the i layer 9 and the p layer 10 are connected in parallel. The glass substrate 1 is irradiated by light from the direction represented by the arrow.

A description is now provided of an outline of a manufacturing method for the amorphous solar cell illustrated in FIG. 1.

First, a glass substrate 1 having a thickness of 1.1 mm is prepared. Then, ITO is evaporated over the glass substrate 1 to a thickness of 1800 Å and $SnO_2$ is evaporated to a thickness of 200 Å. Consequently, a transparent conductive film 2 is formed on the glass substrate 1. Next, a p layer 4, an i layer 5 and an n layer 6 are successively formed on the transparent conductive film 2 in the above described order by a conventional RF glow discharge. The temperature of the substrate while forming each of the p layer, the i layer and the n layer is held constant, such as at a temperature of 200° C. The gases that may be used for forming the p layer are $SiH_4$, $CH_4$, $H_2$ $B_2H_6$. The flow rates of $SiH_4$, $CH_4$ and $H_2$ and 30 SCCM, 30 SCCM and 160 SCC, respectively, and the flow rate of $B_2H_6$ satisfies the condition of $B_2H_6/(SiH_4+CH_4)=970$ ppm. In addition, the gas pressure is 0.32 Torr and the RF power is 7 watts.

The gases used for forming the i layer are $SiH_4$ and $H_2$, and the flow rates thereof are 60 SCCM and 20 SCCM, respectively. In addition, the gas pressure is 0.12 Torr, and the RF power is 10 watts.

The gases used for forming the n layer are $SiH_4$, $H_2$ and $PH_3$, and the flow rates of $SiH_4$ and $H_2$ are 50 SCCM and the flow rate of $PH_3$ satisfies the condition of $PH_3/SiF_4=0.1\%$. In addition, the gas pressure is 0.5 watts, and the RF power is 50 watts. Furthermore, the thicknesses of the p layer and the n layer are 200 Å, and the thickness of the i layer is in the range of 1000 to 7000 Å.

Then, in the same manner as described above, a transparent conductive film 7 is formed on the n layer 6. An n layer 8, an i layer 9 and a p layer 10 are successively formed on the n layer 6 in the above described order. Electrodes 3b, 3c and 11 are respectively formed of aluminum to a thickness of 3000 Å. Meanwhile, the thicknesses of the p layers 4 and 10 and the n layers 6 and 8 are 150 Å. The thickness of the i layer 9 of a lower cell 200 is between 1000 Å and 6000 Å.

Next, suitable ranges of the thickness of the i layer 5 of an upper cell 100 and the thickness of the i layer 9 of the lower cell 200 are calculated. The results of the range calculations are illustrated in FIGS. 7 and 8.

Figure 7:
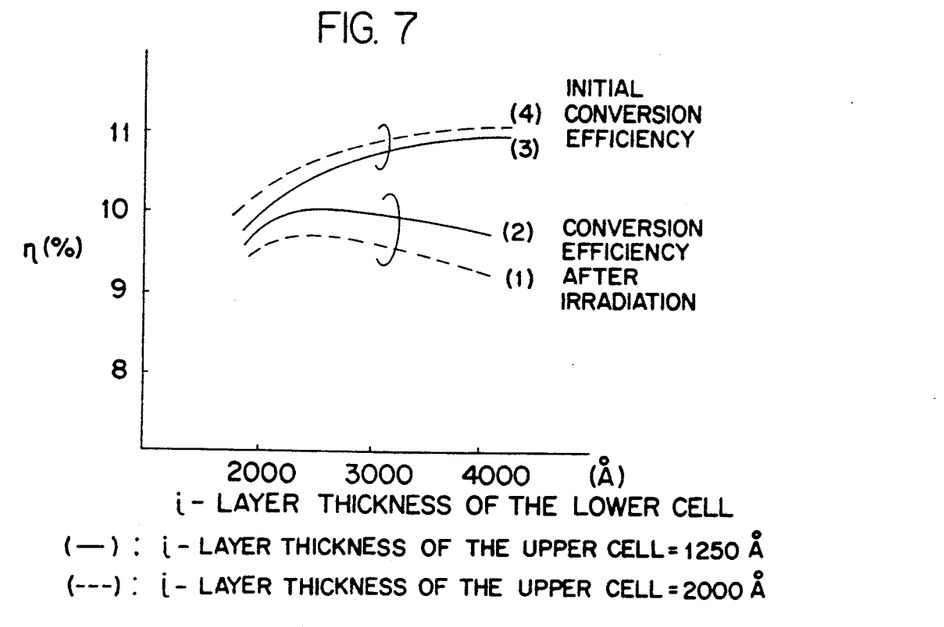
FIG. 7 illustrates the relation between initial conversion efficiency, conversion efficiency after irradiation and the thickness of the i-layer of the upper cell.
Figure 8:
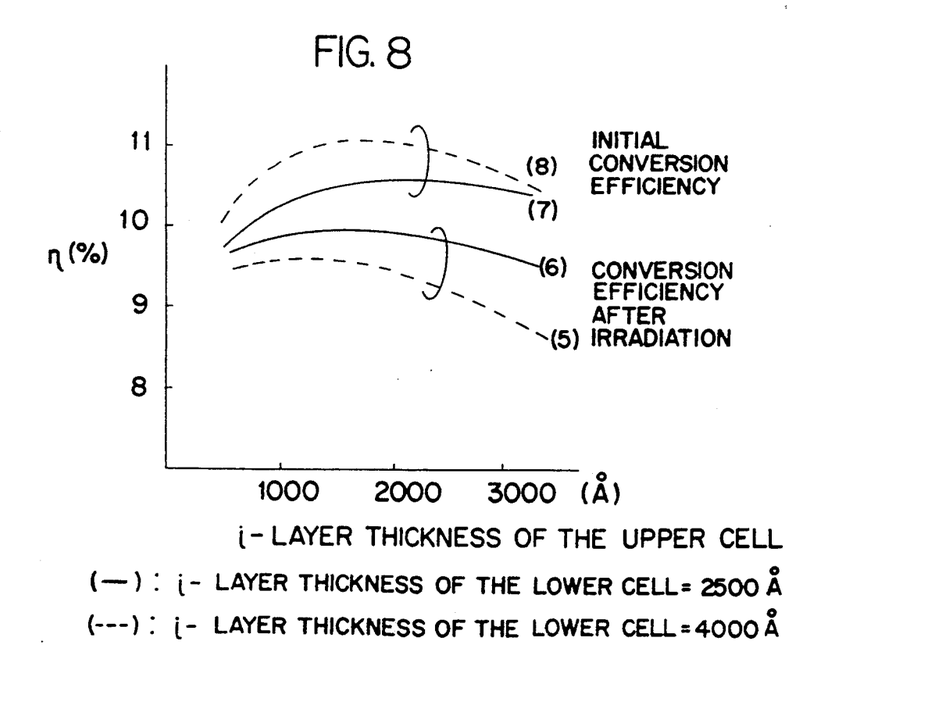
FIG. 8 illustrates the relation between initial conversion efficiency and conversion efficiency after irradiation to the thickness of the i-layer of the upper cell.

FIG. 7 illustrates the relation between initial conversion efficiency, conversion efficiency after irradiation (AM=1.100 mW/cm², 550 hours) and the thickness of the i layer 9 of the lower cell 200, with the thickness of the i layer 5 of the upper cell 100 on the light incident side being maintained at 1250 Å or 2000 Å. In FIG. 7, the ordinate represents the conversion efficiency and the abscissa represents the thickness of the i layer 9 of the lower cell 200. From FIG. 7, the following relations may be clearly understood.

With respect to only the initial conversion efficiency, the conversion efficiency for the larger thickness (2000 Å) of the i layer 5 of the upper cell 100 is higher than the conversion efficiency for the smaller thickness (1250 Å) thereof, as illustrated by curves (3) and (4) of FIG. 7.

With respect to the conversion efficiency after irradiation, the conversion efficiency for the smaller thickness (1250 Å) of the i layer 5 of the upper cell 100 is higher than the conversion efficiency for the larger thickness (2000 Å) thereof, as illustrated by curves (1) and (2) of FIG. 7.

Referring to the curves (1) and (2) of FIG. 7, the conversion efficiency after irradiation becomes lower when the thickness of the i layer 9 of the lower cell 200 exceeds 3000 Å. Therefore, the thickness of the i layer 9 of the lower cell 200 is preferably 3000 Å or less.

Referring to the curve (2) of FIG. 7, it is found that the conversion efficiency of the curve (2) has a maximum value when the thickness of the i layer 9 of the lower cell 200 is approximately 2500 Å. More specifically, the conversion efficiency after irradiation is at a maximum when the ratio of the thickness of the i layer 5 of the upper cell 100 and the thickness of the i layer 9 of the lower cell 200 is 1:2.

FIG. 8 illustrates the relation between the initial conversion efficiency (curves (7) and (8)) and the conversion efficiency (curves (5) and (6)) after irradiation (AM=1.100 mW/cm², 550 hours) to the thickness of the i layer 5 of the upper cell 200. In FIG. 8, the ordinate represents the conversion efficiency and the abscissa represents the thickness of the i layer 5 of the upper cell 100.

From FIG. 8, the following relations may be clearly understood.

If only the initial conversion efficiency is considered, the conversion efficiency for the larger thickness of the i layer 9 of the lower cell 200 is higher than the conversion efficiency for the smaller thickness thereof, as illustrated by curves (7) and (8) of FIG. 8. With respect to the conversion efficiency after irradiation, the conversion efficiency for the smaller thickness of the i layer 9 of the lower cell 200 is higher than the conversion efficiency for the larger thickness thereof, as illustrated by curves (5) and (6) of FIG. 8.

Referring to the curves (5) and (6) of FIG. 8, the conversion efficiency after irradiation becomes lower when the thickness of the i layer 5 of the upper cell 100 exceeds 1500 Å. Therefore, the thickness of the i layer 5 of the upper cell 100 is preferably 1500 Å or less.

Referring to the curve (6) of FIG. 8, it is found that the conversion efficiency of the curve (6) has a maximum value when the thickness of the i layer 5 of the upper cell 100 is approximately between 1000 Å and 1250 Å. More specifically, the conversion efficiency after irradiation is at a maximum when the ratio of the thickness of the i layer 5 of the upper cell 100 and the thickness of the i layer 9 of the lower cell 200 is in a range of 1:2 to 1:2.5.

Figure 9:
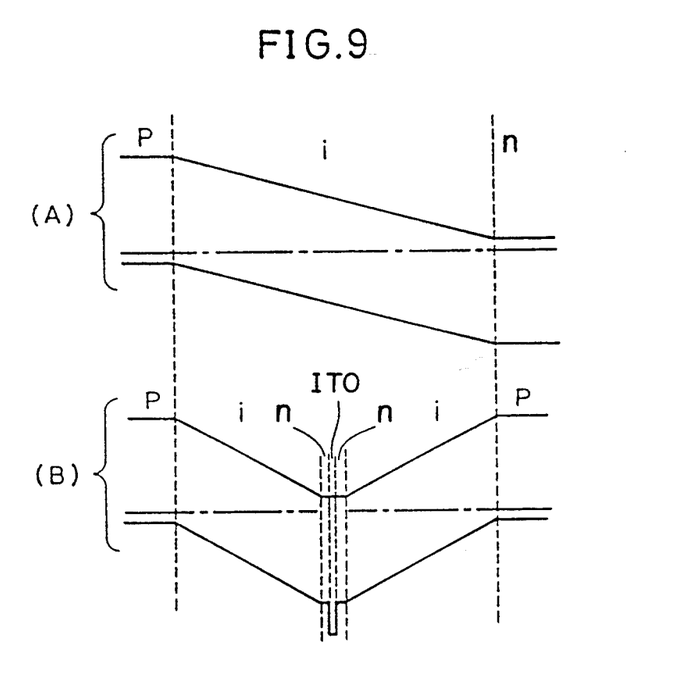
FIG. 9 is a band diagram illustrating the comparison between a conventional single cell and the amorphous solar cell according to the first embodiment.

FIG. 9 is a band diagram illustrating a case in which the thickness of the i layer of the amorphous solar cell is 3000 Å. In FIG. 9, (A) illustrates the energy bands for a conventional single cell, and (B) illustrates the energy bands for the solar cell according to the present embodiment. As is obvious from the band diagram of FIG. 9, the intensity of the electric field of each of the i layers of the cell according to the present embodiment is approximately two times that of the i layer of the conventional single cell. Therefore, in the cell according to the present embodiment, the collection efficiency for the electron-hold pairs generated by light is increased. Even if the thicknesses of all of the i layers are the same as the thickness of the i layer of the conventional single cell, the collection efficiency for the electron-hold pairs is increased, so that Isc and F.F. are increased.

Figure 2:
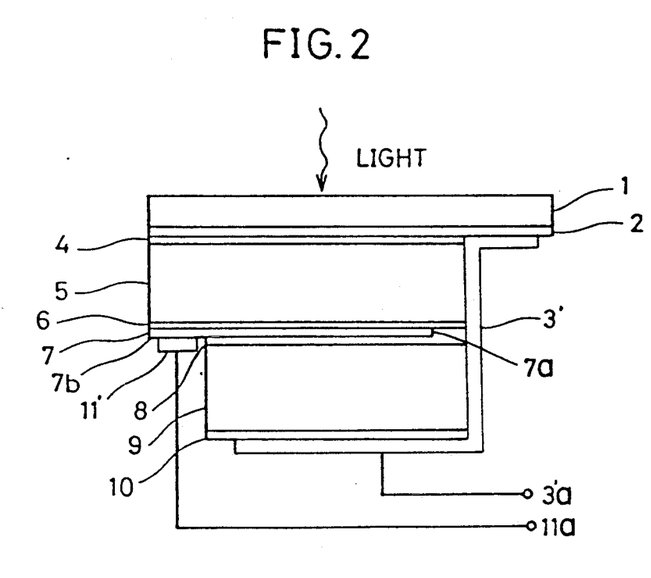
FIG. 2 is a diagram illustrating a structure of an amorphous solar cell according to a second embodiment of the present invention.

FIG. 2 is a diagram illustrating a structure of an amorphous solar cell according to a second embodiment of the present invention. Referring to FIG. 2, this amorphous solar cell includes a glass substrate 1. A transparent conductive film 2, a p layer 4, an i layer 5, an n layer 6, a transparent conductive film 7, an n layer 8, an i layer 9 and a p layer 10 are successively formed on the glass substrate 1 in the above described order. A first cell including the p layer 4, the i layer 5 and the n layer 6 and a second cell including the n layer 8, the i layer 9 and the p layer 10 are stacked such that the first and second cells are positioned in opposite polarity with respect to each other. There is provided an electrode 3' for connecting an end of the transparent conductive film 2 to the p layer 10. The electrode 3' may be a thin film electrode, for example. The transparent conductive film 7 is meanwhile structured such that one end 7a thereof does not contact with the electrode 3'. An electrode 11' is provided on the other end 7b of the transparent conductive film 7.

In the above described structure, the solar cell includes only two terminals so that complex connections are avoided. The electrode 3' is electrically connected to an output terminal 3'a and the electrode 11' is electrically connected to an output terminal 11'a. As a result, the output ends of the first cell including the p layer 4, the i layer 5 and the n layer 6 and the second cell including the n layer 8, the i layer 9 and the p layer 10 are connected in parallel. The glass substrate is irradiated by light from the direction represented by the arrow. In the above described structure, the same effect is achieved as that of the amorphous solar cell according to the first embodiment.

Although in the above described embodiment, a description was made for an amorphous solar cell having a p layer, an i layer, an n layer, a transparent conductive film, an n layer, an i layer and a p layer that are stacked on the substrate in the above described order, it should be noted that the present invention is not limited to this structure. For example, an amorphous solar cell may be used in which an n layer, an i layer, a p layer, a transparent conductive film, a p layer, an i layer and an n layer are stacked on the substrate in the above described order and the output ends of the first cell and the second cell are connected in parallel. Thereby, the same effect as in the above described embodiment is obtained.

Figure 3:
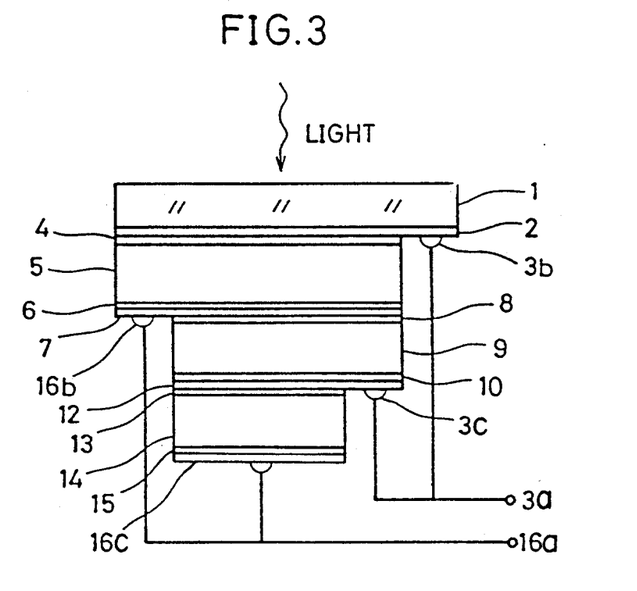
FIG. 3 is a diagram illustrating a structure of an amorphous solar cell according to a third embodiment of the present invention.

FIG. 3 is a diagram illustrating a structure of an amorphous solar cell according to a third embodiment of the present invention.

Referring to FIG. 3, this amorphous solar cell includes a glass substrate 1. A transparent conductive film 2, a p layer 4, an i layer 5, an n layer 6, a transparent conductive film 7, an n layer 8, an i layer 9 a p layer 10, a transparent conductive film 12, a p layer 13, an i layer 14 and an n layer 15 are successively stacked on the glass substrate 1 in the above described order. A first cell including the p layer 4, the i layer 5 and the n layer 6, a second cell including the n layer 8, the i layer 9 and the p layer 10, and a third cell including the p layer 13, the i layer 13 and the n layer 15 are successively stacked such that each of the cells are positioned in opposite polarity with respect to each other. An electrode 3b is formed on an end of the transparent conductive film 2, an electrode 3c is formed on an end of the transparent conductive film 12, an electrode 16b is formed on an end of a transparent conductive film 7, and an electrode 16c is formed on the n layer 15. The electrodes 3b and 3c are connected to an output terminal 3a and the electrodes 16b and 16c are connected to an output terminal 16a, so that output ends of the first cell, the second cell and the third cell are connected in parallel. The glass substrate 1 is irradiated by light from the direction represented by the arrow.

In the above described manner, three cells each having a pin junction structure are stacked and interconnected so that the output current will become larger. Although in the third embodiment, a description has been made of a case in which three cells each having a pin junction structure are stacked, it should be noted that the present embodiment is not limited to this structure. For example, one or more pin junction structures may be further stacked thereon.

Additionally, although in the above described embodiment, a description was made for the case in which (pin), (nip) and (pin) are stacked in the above described order, (nip), (pin) and (nip) may be stacked in the above described reverse order.

Figure 4:
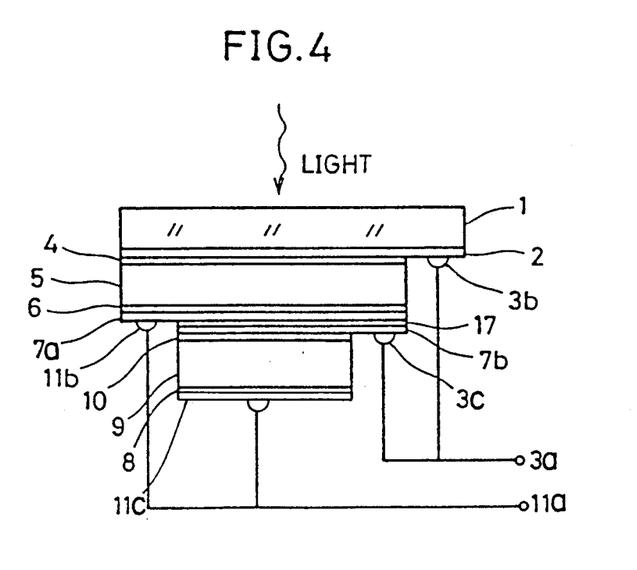
FIG. 4 is a diagram illustrating a structure of an amorphous solar cell according to a fourth embodiment of the present invention.

FIG. 4 is a diagram illustrating a structure of an amorphous solar cell according to a fourth embodiment of the present invention.

Referring to FIG. 4, this amorphous solar cell includes a glass substrate 1. A transparent conductive film 2, a p layer 4, an i layer 5, an n layer 6, a transparent conductive film 7a, a transparent insulating film 17, a transparent conductive film 7b, a p layer 10, an i layer 9 and an n layer 8 are successively stacked on the glass substrate in the above described order.

In this embodiment, because a first cell including the p layer 4, the i layer 5 and the n layer 6 and a second cell including a p layer 10, an i layer 9 and an n layer 8 are separated by the transparent insulting film 17, the cells need not be stacked in an opposite polarity with respect to each other. This, in this case, the following combinations of an upper pin and a lower pin can be freely made: (pin) (pin), (pin) (nip), (nip) (pin) and (nip) (nip).

An electrode 3b is formed on an end of the transparent conductive film 2, an electrode 3c is formed on an end of the transparent conductive film 7b, an electrode 11b is formed on an end of the transparent conductive film 7a, and an electrode 11c is formed on the n layer 8. The electrodes 3b and 3c are connected to an output terminal 3a and the electrodes 11b and 11c are connected to an output terminal 11a, so that the output ends of the first cell and the cell are connected in parallel. The glass substrate 1 is irradiated by light from the direction represented by the arrow. In the above described structure, the same effect as in the above described embodiment is achieved.

Figure 5:
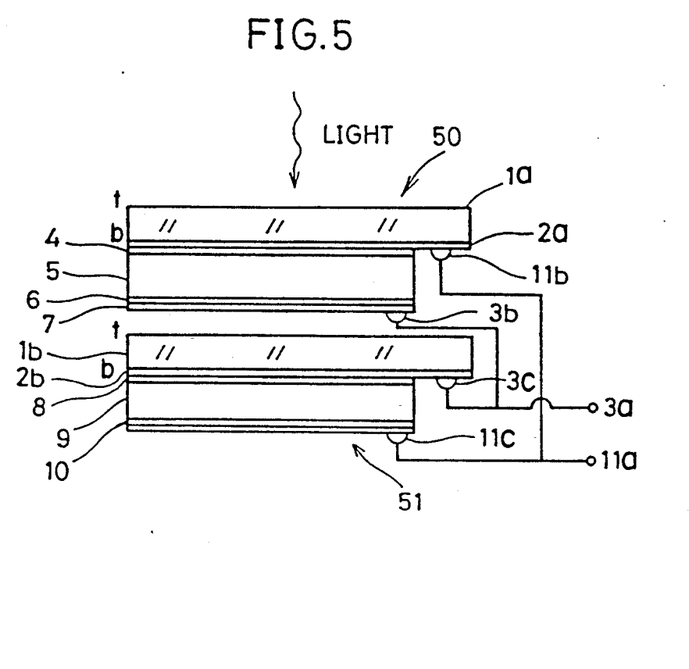
FIG. 5 is a diagram illustrating a structure of an amorphous solar cell according to a fifth embodiment of the present invention.

FIG. 5 is a diagram illustrating a structure of an amorphous solar cell according to a fifth embodiment of the present invention. The amorphous solar cell according to the present embodiment is formed by stacking two single cells that are respectively formed on glass substrates.

A single cell 50 on the light incident side includes a first glass substrate 1a. A transparent conductive film 2a, a p layer 4, an i layer 5, an n layer 6 and a transparent conductive film 7 are successively stacked on one surface of the first glass substrate 1a in the above described order. The other single cell 51 includes a second glass substrate 1b. A transparent conductive film 2b, an n layer 8, an i layer 9 and a p layer 10 are successively stacked on one surface of the second glass substrate 1b in the above described order. The single cell 50 on the light incident side and the other single cell 51 are stacked such that the respective other surfaces of the first glass substrate 1a and the second glass substrate 1b face in the same direction. An electrode 3b is formed on an end of the transparent conductive film 7, an electrode 3c is formed on an end of the transparent conductive film 2b, an electrode 11b is formed on an end of the transparent conductive film 2a, and an electrode 11c is formed on the p layer 10. The electrodes 11b and 11c are connected to an output terminal 11a and the electrodes 3b and 3c are connected to an output terminal 3a, so that the output ends of the single cell 50 on the light incident side and the other single cell 51 are connected in parallel. The glass substrate 1a is irradiated by light from the direction represented by the arrow. In the above described structure, the same effect as that in the above described embodiment is achieved.

Figure 6:
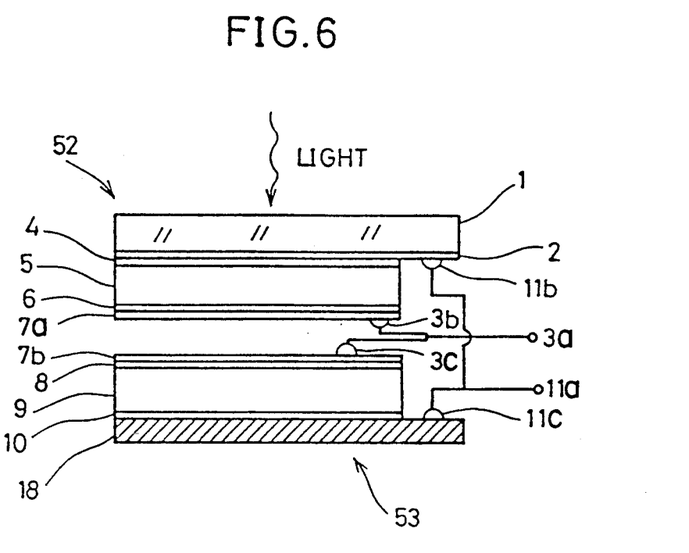
FIG. 6 is a diagram illustrating a structure of an amorphous solar cell according to a sixth embodiment of the present invention.

FIG. 6 is a diagram illustrating a structure of an amorphous solar cell according to a sixth embodiment of the present invention. The amorphous solar cell according to the present embodiment is formed by stacking a single cell that is formed on a glass substrate and a single cell that is formed on a conductive substrate.

The single cell 52 on the light incident side includes a glass substrate 1. A transparent conductive film 2, a p layer 4, an i layer 5, an n layer 6 and a transparent conductive film 7a are successively stacked on the glass substrate 1 in the above described order. The other single cell 53 includes a conductive substrate 18. A p layer 10, an i layer 9, an n layer 8 and a transparent conductive film 7b are stacked on the conductive substrate 18 in the above described order. The single cell 52 on the light incident side and the other single cell 53 are stacked such that the distance between the glass substrate 1 and the conductive substrate 1 is a maximum. An electrode 11b is formed on an end of the transparent conductive film 2, an electrode 11c is formed on an end of the conductive substrate 18, an electrode 3b is formed on an end of the transparent conductive film 7a, and an electrode 3c is formed on an of the transparent conductive film 7b. The electrodes 11b and 11c are connected to an output terminal 11a and the electrodes 3b and 3c are connected to an output terminal 3a, so that the output ends of the single cell 52 on the light incident side and the other single cell 53 are connected in parallel. The glass substrate 1 is irradiated by light from the direction represented by the arrow. In the above described structure, the same effect as that in the above described embodiment is achieved.

Although in the embodiments illustrated in FIGS. 5 and 6, descriptions were made for cases in which two devices are stacked, it should be noted that the present invention is not limited to the same. For example, three or more devices may be stacked. In this case, a transparent electrode and a transparent substrate must be respectively used as another electrode and substrate. However, a transparent material need not be used for an electrode or a substrate in a position farthest away from the side of incident light.

Additionally, in FIGS. 5 and 6, a method of stacking the single cells includes mechanically stacking single cells, laminating single cells with an insulative resin, and laminating single cells through an insulative sheet, As described above, the amorphous solar cell according to the present invention includes upper and lower cells which each include i layers. The upper and lower cells are stacked so that the upper cell is located on the light incident side. Because the output end of the upper cell and the lower cell are connected in parallel, it is not necessary to make the current value generated in the i layer of the upper cell and the current value generated in the i layer of the lower cell equal. Therefore, the i layer of the lower cell can be made to have a thickness of less than 3000 Å. Because the thickness of the i layer of the lower cell can be made to be 3000 Å or less, it is possible to obtain an amorphous solar cell having a high initial photoelectric conversion efficiency with a suppressed photo degradation rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amorphous solar cell device which comprises at least two junction structures each including a p layer, an i layer and an n layer for generating an electromotive force when the cell is irradiated by light, comprising:
   a lower cell including an output end and an i layer having a thickness less than 3000 Å; and
   an upper cell including an output end and being stacked on said lower cell so that said upper cell is located on a light incident side of said lower cell said output end of said upper cell and said output end of said lower cell being connected in parallel.

2. An amorphous solar cell in accordance with claim 1, wherein said upper cell comprises an i layer of thickness less than 1500 Å.

3. An amorphous solar cell in accordance with claim 2, wherein the ratio of the i layer of said upper cell and the thickness of the i layer of said lower cell is between 1:2 and 1:2.5.

4. The amorphous solar cell according to claim 2, further comprising a thin film electrode for connecting said output ends of said lower cell and said upper cell in parallel integrally with the solar cell.

5. The amorphous solar cell according to claim 1, wherein
   said lower cell and said upper cell are stacked so that the polarity of said lower cell is opposite to the polarity of said upper cell stacked thereon.

6. The amorphous solar cell according to claim 1, further comprising:
   a third cell disposed between said upper and lower cells having a junction structure including a p layer, an i layer and an n layer, said upper, lower and third cells being stacked so that the polarity of each cell which is opposed to the respective stacked cell is opposite to the polarity of the respective stacked cell.

7. The amorphous solar cell according to claim 1, wherein
   said lower cell and said upper cell being stacked with a transparent insulating film disposed therebetween.

8. The amorphous solar cell according to claim 1, further comprising:
   a glass substrate having a top surface and a bottom surface;
   said upper cell being disposed on said bottom surface of said first glass substrate;
   a second glass substrate having a top surface and a bottom surface; and
   said lower cell being disposed on said bottom surface of said second glass substrate, said upper cell and said lower cell being stacked so that said bottom surfaces of said first and second glass substrates face in the same direction.

9. The amorphous solar cell according to claim 1, further comprising:
a glass substrate;
said upper cell being disposed on said glass substrate;
a conductive substrate; and
said lower cell being disposed on said conductive substrate, said upper cell and said lower cell being stacked so that the distance separating said glass substrate and said conductive substrate is at a maximum.

10. The amorphous solar cell according to claim 1, wherein the thickness of the i layer of each of said upper and lower cells is less than 3000 Å.

11. An amorphous solar cell device which comprises at least two junction structures each including a p layer, an i layer and an n layer for generating an electromotive force when said solar cell is irradiated by light, comprising:
a lower cell including an output end; and
an upper cell including an output end and an i layer having a thickness less than 1500 Å, said upper cell and said lower cell being stacked so that said upper cell is located on a light incident side of said lower cell, said output end of said upper cell and said output end of said lower cell being connected in parallel.

12. An amorphous solar cell device which comprises at least two junction structures each including a p layer, an i layer and an n layer for generating an electromotive force when said solar cell is irradiated by light, comprising:
a lower cell including an output end and an i layer having a first thickness of less than 3000 Å; and
an upper cell including an output end and an i layer having a second thickness, said upper cell and said lower cell being stacked so that said upper cell is located on a light incident side of said lower cell, said output end of said upper cell and said output end of said lower cell being connected in parallel and the ratio of said first thickness of said i layer of said upper cell and said second thickness of said i layer of said lower cell is in the range between 1:2 and 1:2.5.

13. A method for forming an amorphous solar cell device comprising at least two junction structures each including a p layer, an i layer and an n layer for generating an electromotive force when the cell is irradiated by light, comprising the steps of:
forming a lower cell including an output end and an i layer having a first thickness of less than 3000 Å;
forming an upper cell including an output end and an i layer having a second thickness;
stacking said upper cell on said lower cell so that the upper cell is located on a light incident side of said lower cell; and
connecting said output end of said upper cell to said output end of said lower cell in parallel.

14. The method in accordance with claim 13, wherein said second thickness of said i layer of said upper cell less than 1500 Å.

15. The method in accordance with claim 13, wherein said first and second thickness of said i layers of said lower and upper cells are formed to have a ration in the range between 1:2 and 1:2.5.

* * * * *